(12) United States Patent
Shindome et al.

(10) Patent No.: US 12,543,339 B2
(45) Date of Patent: Feb. 3, 2026

(54) SEMICONDUCTOR DEVICE

(71) Applicant: KABUSHIKI KAISHA TOSHIBA, Tokyo (JP)

(72) Inventors: Aya Shindome, Yokohama Kanagawa (JP); Ikuo Fujiwara, Yokohama Kanagawa (JP); Hiroshi Ono, Tokyo (JP); Yosuke Kajiwara, Yokohama Kanagawa (JP); Masahiko Kuraguchi, Yokohama Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 369 days.

(21) Appl. No.: 18/358,265

(22) Filed: Jul. 25, 2023

(65) Prior Publication Data

US 2024/0243196 A1 Jul. 18, 2024

(30) Foreign Application Priority Data

Jan. 17, 2023 (JP) ................................ 2023-005116

(51) Int. Cl.
*H10D 30/47* (2025.01)
*H10D 62/10* (2025.01)
(Continued)

(52) U.S. Cl.
CPC ........... *H10D 30/475* (2025.01); *H10D 62/10* (2025.01); *H10D 62/8503* (2025.01); *H10D 64/411* (2025.01)

(58) Field of Classification Search
CPC .. H10D 30/015; H10D 30/471; H10D 30/472; H10D 30/473; H10D 30/4732;
(Continued)

(56) References Cited

U.S. PATENT DOCUMENTS 9,231,059 B2   1/2016   Negoro et al.
9,252,254 B2   2/2016   Shimizu et al.
(Continued)

FOREIGN PATENT DOCUMENTS

JP   WO2011/132284 A1   10/2011
JP   WO2012/172753 A1   12/2012
(Continued)

OTHER PUBLICATIONS

Japan Patent Office, Office Action in JP App. No. 2023-005116, (Aug. 5, 2025).

*Primary Examiner* — Eric A. Ward
(74) *Attorney, Agent, or Firm* — Finnegan, Henderson, Farabow, Garrett & Dunner, LLP

(57) ABSTRACT

According to one embodiment, a semiconductor device includes a first electrode, a second electrode, a third electrode, a first semiconductor region, a second semiconductor region, a first nitride region, a first insulating member, and a second insulating member. The third electrode includes a first electrode portion and a second electrode portion. The first semiconductor region includes $Al_{x1}Ga_{1-x1}N$ ($0 \leq x1 < 1$). The second semiconductor region includes $Al_{x2}Ga_{1-x2}N$ ($0 < x2 < 1$, $x1 < x2$). The first nitride region includes $Al_{z1}Ga_{1-z1}N$ ($0 < z1 \leq 1$, $x2 < z1$). The second insulating member includes a first insulating region. A part of the first insulating region is located between the fifth partial region of the first semiconductor region and the second electrode portion of the third electrode in the second direction.

20 Claims, 4 Drawing Sheets

(51) Int. Cl.
*H10D 62/85* (2025.01)
*H10D 64/27* (2025.01)

(58) Field of Classification Search
CPC ........... H10D 30/4735; H10D 30/4738; H10D 30/474; H10D 30/475; H10D 30/4755; H10D 30/476; H10D 30/477; H10D 30/478; H10D 30/481; H10D 30/485; H10D 62/8503
See application file for complete search history.

(56) References Cited

U.S. PATENT DOCUMENTS

| | | | |
|---|---|---|---|
| 2014/0353720 A1* | 12/2014 | Inoue | H10D 30/4732 438/270 |
| 2015/0145004 A1* | 5/2015 | Inoue | H10D 64/513 438/270 |
| 2016/0260615 A1* | 9/2016 | Hirai | H10D 30/475 |
| 2019/0371927 A1 | 12/2019 | Kajiwara et al. | |
| 2020/0220003 A1* | 7/2020 | Kuraguchi | H10D 30/475 |
| 2020/0295169 A1 | 9/2020 | Kato et al. | |
| 2022/0045202 A1 | 2/2022 | Kajiwara et al. | |
| 2022/0102544 A1 | 3/2022 | Shimizu et al. | |

FOREIGN PATENT DOCUMENTS

| | | |
|---|---|---|
| JP | 2013-118343 A | 6/2013 |
| JP | 2016-162879 A | 9/2016 |
| JP | 2019-207942 A | 12/2019 |
| JP | 2020-150141 A | 9/2020 |
| JP | 2020-205449 A | 12/2020 |
| JP | 2022-30079 A | 2/2022 |

* cited by examiner

SEMICONDUCTOR DEVICE

CROSS-REFERENCE TO RELATED APPLICATIONS

This application is based upon and claims the benefit of priority from Japanese Patent Application No. 2023-005116, filed on Jan. 17, 2023; the entire contents of which are incorporated herein by reference.

FIELD

Embodiments of the invention generally relate to a semiconductor device.

BACKGROUND

For example, in semiconductor devices, stable characteristics are desired.

DETAILED DESCRIPTION

Figure 1:
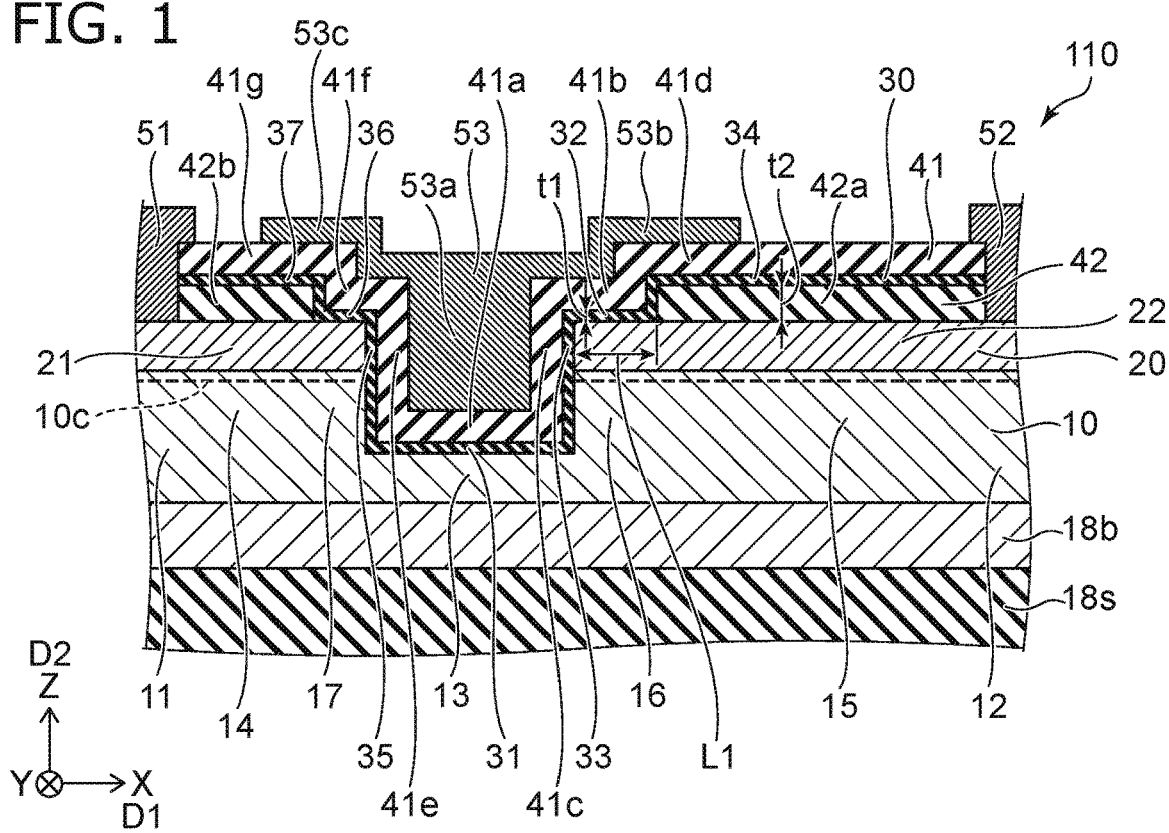
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a first nitride region, a first insulating member, and a second insulating member. A direction from the first electrode to the second electrode is along a first direction. The third electrode includes a first electrode portion and a second electrode portion. A position of the third electrode in the first direction is between a position of the first electrode in the first direction and a position of the second electrode in the first direction. The second electrode portion is connected to the first electrode portion. The first semiconductor region includes $Al_{x1}Ga_{1-x1}N$ (0≤x1<1). The first semiconductor region includes a first partial region, a second partial region, a third partial region, a fourth partial region, a fifth partial region, and a sixth partial region. A second direction from the first partial region to the first electrode crosses the first direction. A direction from the second partial region to the second electrode is along the second direction. A direction from the third partial region to the first electrode portion is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. A position of the sixth partial region in the first direction is between the position of the third partial region in the first direction and the position of the fifth partial region in the first direction. The second semiconductor region includes $Al_{x2}Ga_{1-x2}N$ (0<x2<1, x1<x2). The second semiconductor region includes a first semiconductor portion and a second semiconductor portion. A direction from the fourth partial region to the first semiconductor portion is along the second direction. A direction from the fifth partial region and the sixth partial region to the second semiconductor portion is along the second direction. The first nitride region includes $Al_{z1}Ga_{1-z1}N$ (0<z1≤1, x2<z1). The first nitride region includes a first nitride portion and a second nitride portion. The first nitride portion is located between the third partial region and the first electrode portion. The second nitride portion is located between the sixth partial region and the second electrode portion. The first insulating member includes a first insulating portion and a second insulating portion. The first insulating portion is located between the first nitride portion and the first electrode portion in the second direction. The second insulating portion is located between the second nitride portion and the second electrode portion in the second direction. The first insulating member includes oxygen and at least one selected from the group consisting of Si and Al. The second insulating member includes a first insulating region. A direction from the fifth partial region to the first insulating region is along the second direction. The second nitride portion is located between the first electrode portion and the first insulating region in the first direction. A part of the first insulating region is located between the fifth partial region and the second electrode portion in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to the first embodiment.

As shown in FIG. 1, a semiconductor device 110 according to the embodiment includes a first electrode 51, a second electrode 52, a third electrode 53, a first semiconductor region 10, a second semiconductor region 20, a first nitride region 30, a first insulating member 41 and a second insulating member 42.

A direction from the first electrode 51 to the second electrode 52 is along a first direction D1. The first direction D1 is defines as an X-axis direction. One direction perpendicular to the X-axis direction is defined as a Z-axis direction. A direction perpendicular to the X-axis direction and the Z-axis direction is defined as a Y-axis direction.

The third electrode 53 includes a first electrode portion 53a and a second electrode portion 53b. A position of the third electrode 53 in the first direction D1 is between a position of the first electrode 51 in the first direction D1 and a position of the second electrode 52 in the first direction D1. The second electrode portion 53b is connected to the first electrode portion 53a. The second electrode portion 53b may be continuous with the first electrode portion 53a. The boundary between the second electrode portion 53b and the first electrode portion 53a may be clear or unclear.

The first semiconductor region 10 includes $Al_{x1}Ga_{1-x1}N$ ($0 \leq x1 < 1$). The composition ratio x1 may be, for example, not less than 0 and not more than 0.1. The first semiconductor region 10 is, for example, a GaN layer. The first semiconductor region 10 includes a first partial region 11, a second partial region 12, a third partial region 13, a fourth partial region 14, a fifth partial region 15 and a sixth partial region 16. A second direction D2 from the first partial region 11 to the first electrode 51 crosses the first direction D1. The second direction D2 is, for example, the Z-axis direction.

A direction from the second partial region 12 to the second electrode 52 is along the second direction D2. A direction from the third partial region 13 to the first electrode portion 53a is along the second direction D2. A position of the fourth partial region 14 in the first direction D1 is between a position of the first partial region 11 in the first direction D1 and a position of the third partial region 13 in the first direction D1. A position of the fifth partial region 15 in the first direction D1 is between the position of the third partial region 13 in the first direction D1 and a position of the second partial region 12 in the first direction D1. A position of the sixth partial region 16 in the first direction D1 is between the position of the third partial region 13 in the first direction D1 and the position of the fifth partial region 15 in the first direction D1. The boundaries between these partial regions need not be clear.

The second semiconductor region 20 includes $Al_{x2}Ga_{1-x2}N$ ($0 < x2 < 1$, $x1 < x2$). The composition ratio x2 may be, for example, not less than 0.1 and not more than 0.35. The second semiconductor region 20 is, for example, an AlGaN layer. The second semiconductor region 20 includes a first semiconductor portion 21 and a second semiconductor portion 22. A direction from the fourth partial region 14 to the first semiconductor portion 21 is along the second direction D2. A direction from the fifth partial region 15 and the sixth partial region 16 to the second semiconductor portion 22 is along the second direction D2.

The first nitride region 30 includes $Al_{z1}Ga_{1-z1}N$ ($0 < z1 \leq 1$, $x2 < z1$). The composition ratio z1 may be, for example, not less than 0.8 and not more than 1. The first nitride region 30 may be, for example, an AlN layer. The first nitride region 30 includes a first nitride portion 31 and a second nitride portion 32. The first nitride portion 31 is located between the third partial region 13 and the first electrode portion 53a. The second nitride portion 32 is located between the sixth partial region 16 and the second electrode portion 53b.

The first insulating member 41 includes a first insulating portion 41a and a second insulating portion 41b. The first insulating portion 41a is located between the first nitride portion 31 and the first electrode portion 53a in the second direction D2. The second insulating portion 41b is located between the second nitride portion 32 and the second electrode portion 53b in the second direction D2. The first insulating member 41 includes oxygen and at least one selected from the group consisting of Si and Al. The first insulating member 41 includes, for example, silicon oxide. The first insulating member 41 may include aluminum oxide.

The second insulating member 42 includes a first insulating region 42a. A direction from the fifth partial region 15 to the first insulating region 42a is along the second direction D2. The second nitride portion 32 is located between the first electrode portion 53a and the first insulating region 42a in the first direction D1. A part of the first insulating region 42a is located between the fifth partial region 15 and the second electrode portion 53b in the second direction D2.

A current flowing between the first electrode 51 and the second electrode 52 can be controlled by a potential of the third electrode 53. The potential of the third electrode 53 may be, for example, a potential based on a potential of the first electrode 51. The first electrode 51 functions, for example, as a source electrode. The second electrode 52 functions as a drain electrode. The third electrode 53 functions as a gate electrode. The semiconductor device 110 is a transistor.

The first semiconductor region 10 includes a portion facing the second semiconductor region 20. A carrier region 10c is formed in this portion. The carrier region 10c is, for example, a two-dimensional electron gas. The semiconductor device 110 is, for example, a HEMT (High Electron Mobility Transistor).

The distance between the first electrode 51 and the third electrode 53 is shorter than the distance between the third electrode 53 and the second electrode 52. A long distance between the third electrode 53 and the second electrode 52 provides, for example, a high breakdown voltage.

In the embodiment, the second nitride portion 32 and the first insulating region 42a are provided above the second semiconductor portion 22 between the gate electrode and the drain electrode. For example, the second nitride portion 32 contacts a part of the second semiconductor portion 22. For example, the first insulating region 42a contacts another part of the second semiconductor portion 22. An electric field tends to concentrate at the end of the second electrode portion 53b. In the embodiment, the first insulating region 42a is provided below the end of the second electrode portion 53b. Thereby, it becomes easy to obtain a high breakdown voltage.

On the other hand, the second nitride portion 32 of nitride is provided on the second semiconductor portion 22 in a portion close to the gate electrode. As a result, for example, change in the threshold voltage can be suppressed. Furthermore, the second insulating portion 41b is provided between the second nitride portion 32 and the second electrode portion 53b. Thereby, a high breakdown voltage can be obtained. Appropriate threshold characteristics are obtained.

Examples of experimental results regarding the semiconductor device 110 will be described below. In the experiments, a length L1 (see FIG. 1) of the second nitride portion 32 along the first direction D1 is changed. The length L1 corresponds to the distance between the end of the second nitride portion 32 on the side of the first electrode portion 53a and the position of the boundary between the second nitride portion 32 and the first insulating region 42a.

Figure 2:
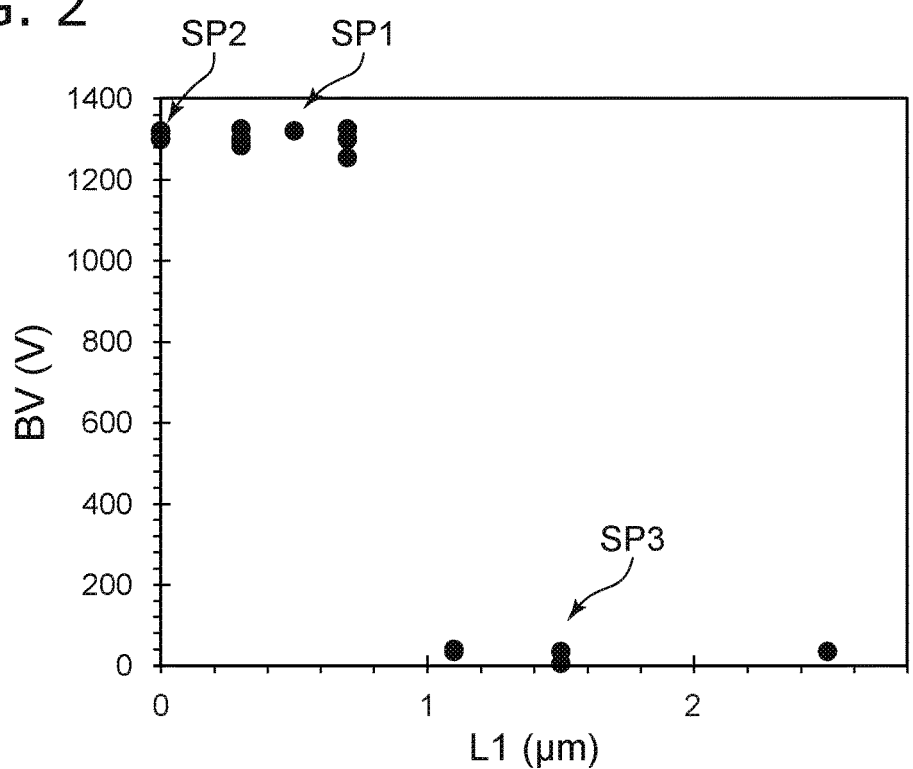
FIG. 2 is a graph illustrating characteristics of the semiconductor devices.

FIG. 2 is a graph illustrating characteristics of the semiconductor devices.

The horizontal axis in FIG. 2 is the length L1. The vertical axis is the breakdown voltage BV. When the length L1 is 0, the second nitride portion 32 is not provided and the first insulating region 42a is provided over the entire second semiconductor portion 22. In this example, when the length L1 is 1 µm, the position of the boundary between the second nitride portion 32 and the first insulating region 42a in the first direction D1 overlaps the position of the end of the second electrode portion 53b in the first direction D1 in the second direction D2.

As shown in FIG. 2, a high breakdown voltage BV is obtained when the length L1 is less than 1 µm. When the length L1 exceeds 1 µm, the breakdown voltage BV is low. A state in which the length L1 is less than 1 µm corresponds to a state in which a part of the first insulating region 42a overlaps the second electrode portion 53b in the second direction D2. From the results of FIG. 2, it is preferable that a part of the first insulating region 42a overlap the second electrode portion 53b in the second direction D2. Thereby, a high breakdown voltage BV can be obtained. As described above, "the length L1 is less than 1 μm" corresponds to a state in which a part of the first insulating region 42a overlaps the second electrode portion 53b in the second direction D2. When a part of the first insulating region 42a overlaps the second electrode portion 53b in the second direction D2, the length L1 is not limited to the value in the above example.

As shown in FIG. 2, in a first sample SP1, the length L1 is 0.5 μm. In a second sample SP2, the length L1 is 0 μm. In a third sample SP3, the length L1 is 1.5 μm.

Examples of PBTI (Positive Bias Temperature Instability) test results for these three samples are described below.

Figure 3:
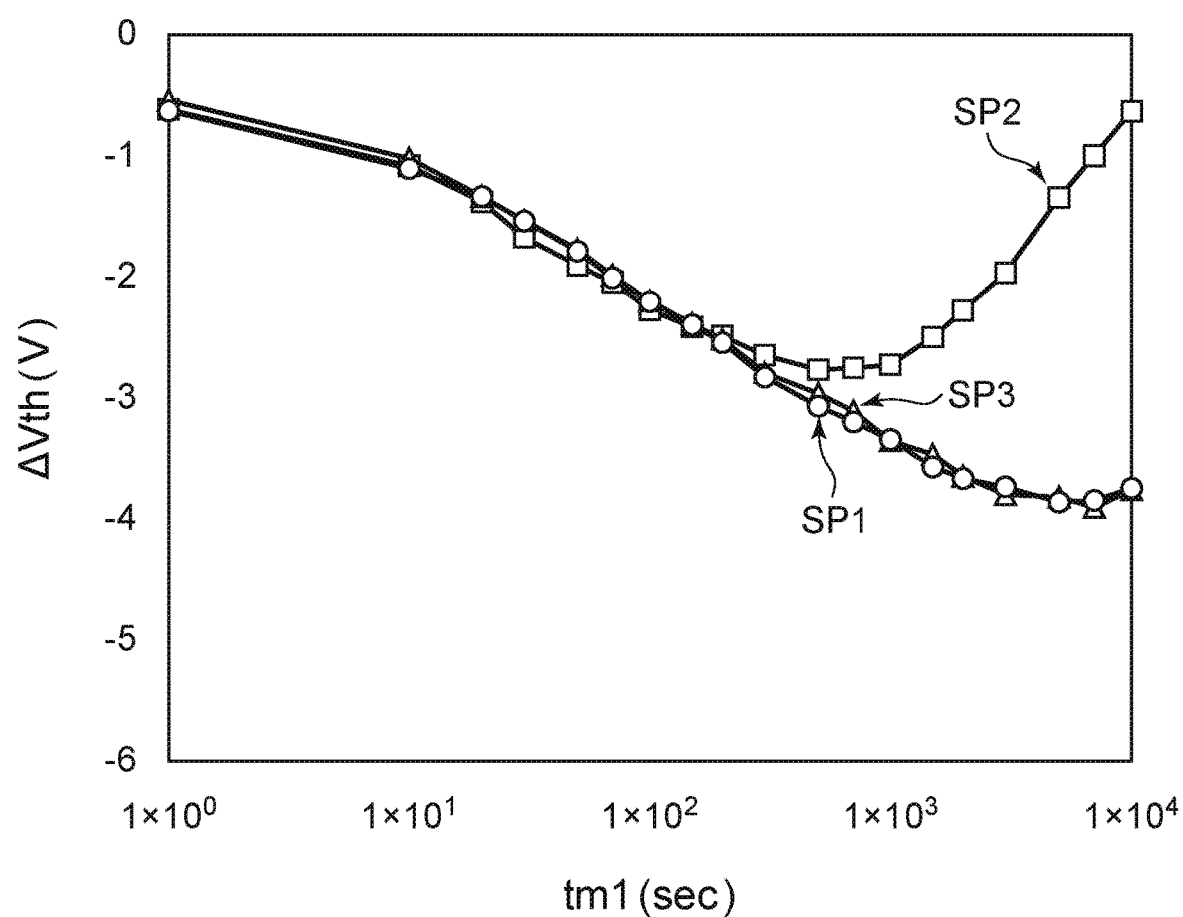
FIG. 3 is a graph illustrating characteristics of the semiconductor devices.

FIG. 3 is a graph illustrating characteristics of the semiconductor devices.

The horizontal axis of FIG. 3 is the time tm1 in the PBTI test. The vertical axis is the threshold voltage change ΔVth. As shown in FIG. 3, in the first sample SP1 and the third sample SP3, the threshold voltage change ΔVth decreases with time tm1. On the other hand, in the second sample SP2, the threshold voltage change ΔVth decreases with time tm1 and then increases. As already explained, the second nitride portion 32 is not provided in the second sample SP2 having the length L1 of 0 μm. In the second sample SP2, the first insulating region 42a is provided over the entire second semiconductor portion 22. In the second sample SP2, the first insulating region 42a is also provided in the vicinity of the gate electrode (first electrode portion 53a). It is considered that this causes a component that increases with time tm1 after the threshold voltage decreases.

In the embodiment (first sample SP1), the second nitride portion 32 and the first insulating region 42a are provided. Thereby, for example, a high breakdown voltage BV can be obtained (see FIG. 2). In the embodiment (first sample SP1), the component of threshold voltage change ΔVth that increases with time tm1 is suppressed (see FIG. 3). According to the embodiments, it is possible to provide a semiconductor device with stable characteristics.

It is considered that there are two types of traps in the second sample SP2. One of the two types of traps is considered to decrease threshold voltage change ΔVth with time tm1. The other one of the two types of traps is considered to increase the threshold voltage change ΔVth with time tm1. It is considered that the latter trap is suppressed in the first sample SP1.

In the embodiment, for example, the second nitride portion 32 includes crystals. The second nitride portion 32 is crystalline. As a result, a high carrier density can be obtained in the region (for example, the sixth partial region 16) overlapping the second nitride portion 32.

On the other hand, for example, the first insulating region 42a is amorphous. As a result, the carrier density is low in the region (for example, the fifth partial region 15) overlapping the first insulating region 42a.

By the carrier density being high in the vicinity of the first electrode portion 53a, for example, the on-resistance can be reduced. By not providing the second insulating member 42 in the vicinity of the first electrode portion 53a, for example, the change in the threshold voltage is likely to be suppressed. By the carrier density being low below the edge of the second electrode portion 53b, for example, a high breakdown voltage BV can be easily obtained.

As shown in FIG. 1, a thickness of the second nitride portion 32 along the second direction D2 is defined as a first thickness t1. The first thickness t1 is preferably, for example, not less than 0.5 nm and not more than 10 nm. When the first thickness t1 is 0.5 nm or more, it becomes easy to obtain a high carrier density. When the first thickness t1 is 10 nm or less, for example, high crystallinity can be easily obtained. For example, leak current due to grain boundaries can be reduced.

As shown in FIG. 1, a thickness of the first insulating region 42a along the second direction D2 is defined as a second thickness t2. The second thickness t2 is preferably, for example, not less than 5 nm and not more than 200 nm. When the second thickness t2 is 5 nm or more, for example, it becomes easy to obtain a high breakdown voltage BV. When the second thickness t2 is 200 nm or less, for example, an amorphous film can be stably obtained easily. For example, leak current can be reduced.

The first insulating region 42a (second insulating member 42) includes, for example, at least one selected from the group consisting of Si and Al and at least one selected from the group consisting of nitrogen and oxygen. For example, the first insulating region 42a (second insulating member 42) may include at least one selected from the group consisting of silicon oxide, silicon oxynitride, and silicon nitride. For example, the first insulating region 42a (second insulating member 42) may include at least one selected from the group consisting of aluminum oxide and aluminum oxynitride. The first insulating region 42a (second insulating member 42) may include a plurality of films (stacked films) having different compositions.

As shown in FIG. 1, in the semiconductor device 110, at least part of the first electrode portion 53a is located between the first semiconductor portion 21 and the second semiconductor portion 22 in the first direction D1. The third electrode 53 is a recessed type gate electrode. At least a part of the first electrode portion 53a may be provided between the fourth partial region 14 and the sixth partial region 16 in the first direction D1. In embodiments, the third electrode 53 may not be recessed type.

As shown in FIG. 1, the first nitride region 30 may further include a third nitride portion 33. The first insulating member 41 may further include a third insulating portion 41c. The third insulating portion 41c is located between at least a part of the first electrode portion 53a and the second semiconductor portion 22 in the first direction D1. The third nitride portion 33 is located between the third insulating portion 41c and the second semiconductor portion 22 in the first direction D1. The third nitride portion 33 may include crystals.

As shown in FIG. 1, the first nitride region 30 may further include a fourth nitride portion 34. The first insulating member 41 may further include a fourth insulating portion 41d. At least a part of the first insulating region 42a is located between the second semiconductor portion 22 and the fourth insulating portion 41d. At least a part of the fourth nitride portion 34 is located between the first insulating region 42a and the fourth insulating portion 41d. The fourth nitride portion 34 may be amorphous, for example.

As shown in FIG. 1, the first nitride region 30 may further include a fifth nitride portion 35. The first insulating member 41 may further include a fifth insulating portion 41e. The fifth insulating portion 41e is located between the first semiconductor portion 21 and the first electrode portion 53a. The fifth nitride portion 35 is located between the first semiconductor portion 21 and the fifth insulating portion 41e. The fifth nitride portion 35 may include crystals.

As shown in FIG. 1, the first insulating region 42a may contact the second electrode 52. The first insulating region 42a may be separated from the second electrode 52, as will be described below.

As shown in FIG. 1, the first semiconductor region 10 may further include a seventh partial region 17. A position of the seventh partial region 17 in the first direction D1 is between the position of the fourth partial region 14 in the first direction D1 and the position of the third partial region 13 in the first direction D1.

The third electrode 53 may further include a third electrode portion 53c. The third electrode portion 53c is connected to the first electrode portion 53a. A direction from the seventh partial region 17 to the third electrode portion 53c is along the second direction D2. The boundary between the third electrode portion 53c and the first electrode portion 53a may be clear or unclear.

The first nitride region 30 may further include a sixth nitride portion 36. The first insulating member 41 may further include a sixth insulating portion 41f. The sixth nitride portion 36 is located between the first semiconductor portion 21 and the third electrode portion 53c in the second direction D2. The sixth insulating portion 41f is located between the sixth nitride portion 36 and the third electrode portion 53c. In this example, the sixth nitride portion 36 contacts the first semiconductor portion 21.

As shown in FIG. 1, the second insulating member 42 may further include a second insulating region 42b. At least a part of the first semiconductor portion 21 is located between the fourth partial region 14 and the second insulating region 42b in the second direction D2. In this example, the sixth nitride portion 36 is located between the second insulating region 42b and the first electrode portion 53a in the first direction D1.

As shown in FIG. 1, the first nitride region 30 may further include a seventh nitride portion 37. The first insulating member 41 may further include a seventh insulating portion 41g. The second insulating region 42b is located between the first semiconductor portion 21 and the seventh insulating portion 41g. The seventh nitride portion 37 is located between the second insulating region 42b and the seventh insulating portion 41g.

As shown in FIG. 1, in this example, at least a part of the third electrode portion 53c overlaps at least a part of the second insulating region 42b in the second direction D2.

As shown in FIG. 1, the semiconductor device 110 may include a substrate 18s and a nitride layer 18b. The substrate 18s may be, for example, a silicon substrate. The nitride layer 18b includes Al, Ga and nitrogen. The nitride layer 18b is, for example, a buffer layer. The nitride layer 18b is provided on the substrate 18s. The first semiconductor region 10 is provided on the nitride layer 18b. The second semiconductor region 20 is provided on the first semiconductor region 10.

Figure 4:
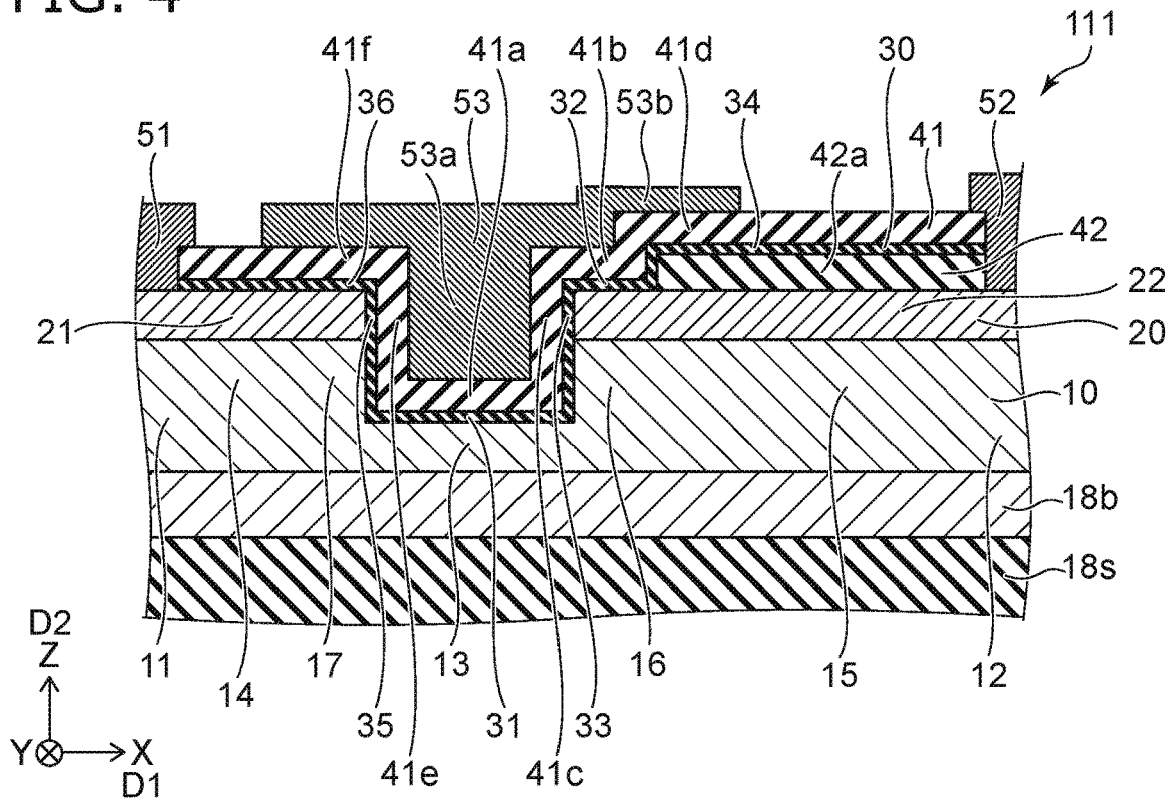
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, in a semiconductor device 111 according to the embodiment, the second insulating region 42b is omitted. Except for this, the configuration of the semiconductor device 111 may be the same as the configuration of the semiconductor device 110.

In the semiconductor device 111, for example, a sixth nitride portion 36 is provided on substantially the entire first semiconductor portion 21. The voltage applied between the first electrode 51 and the third electrode 53 is lower than the voltage applied between the second electrode 52 and the third electrode 53. Practically stable characteristics can be obtained even if the second insulating region 42b is omitted.

Figure 5:
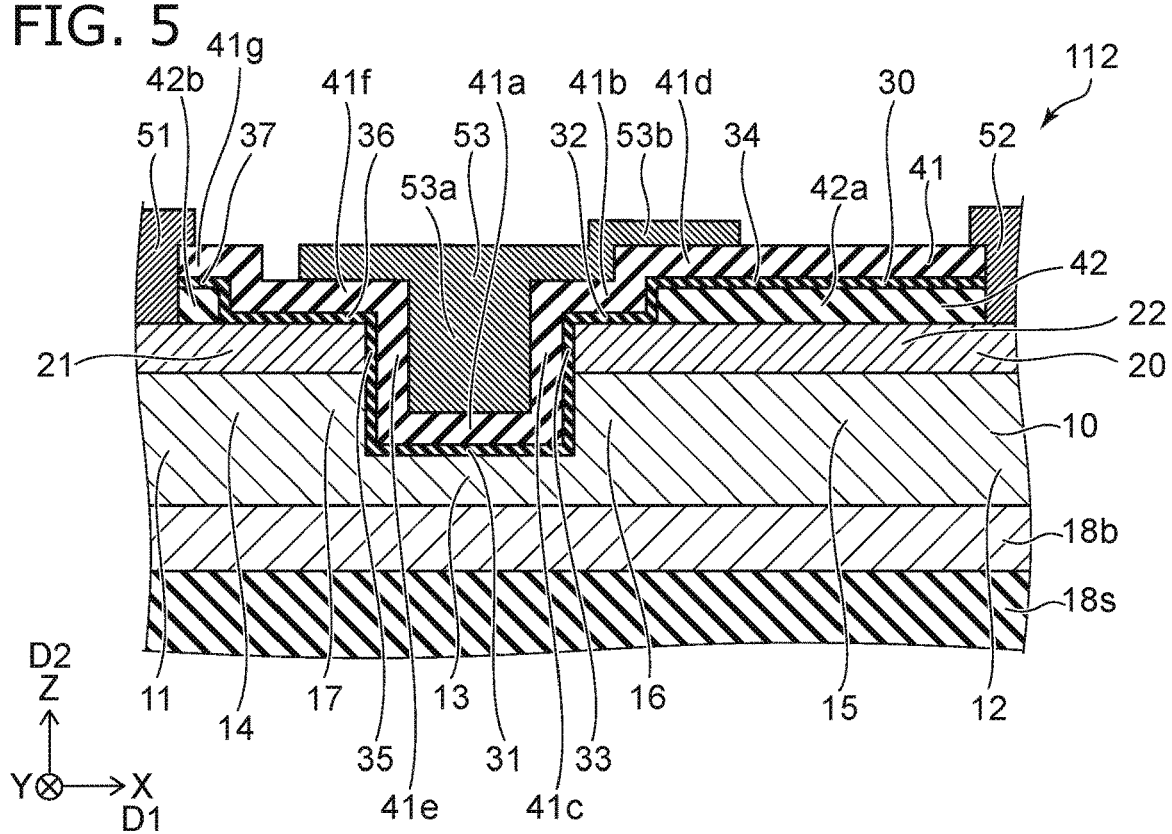
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in a semiconductor device 112 according to the embodiment, a second insulating region 42b is provided. The third electrode portion 53c does not overlap the second insulating region 42b in the second direction D2. Except for this, the configuration of the semiconductor device 112 may be the same as the configuration of the semiconductor device 110. Also in the semiconductor device 112, a practical semiconductor device with stable characteristics can be obtained.

Second Embodiment

Figure 6:
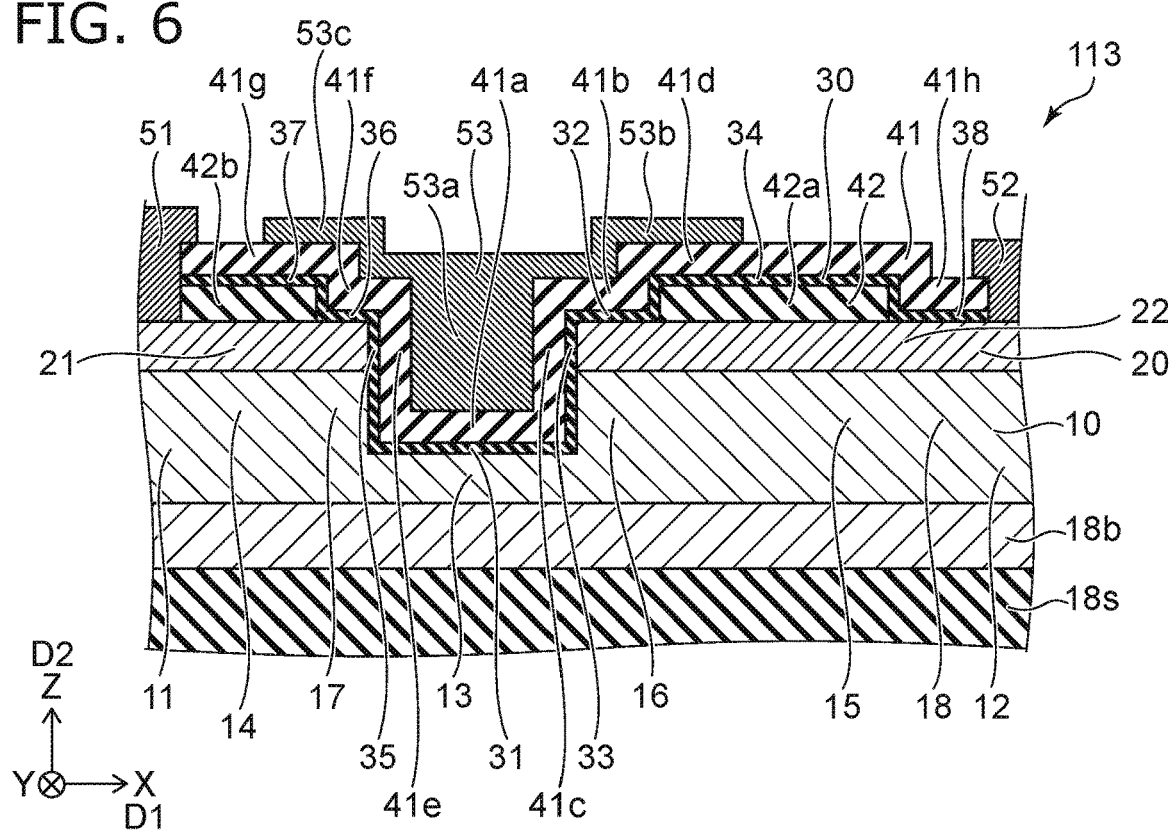
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, in a semiconductor device 113 according to the embodiment, the first semiconductor region 10 further includes an eighth partial region 18. The first nitride region 30 further includes an eighth nitride portion 38. The first insulating member 41 further includes an eighth insulating portion 41h. Except for this, the configuration of the semiconductor device 113 may be the same as that of the semiconductor device 110.

A position of the eighth partial region 18 in the first direction D1 is between the position of the fifth partial region 15 in the first direction D1 and the position of the second partial region 12 in the first direction D1. A direction from the eighth partial region 18 to the eighth nitride portion 38 is along the second direction D2. In this example, the eighth nitride portion 38 is located between a part of the second semiconductor portion 22 and the eighth insulating portion 41h in the second direction D2. The eighth nitride portion 38 contacts the second semiconductor portion 22. For example, the eighth nitride portion 38 is located between the first insulating region 42a and the second electrode 52 in the first direction D1.

Such an eighth nitride portion 38 can suppress collapse, for example. For example, it becomes easy to obtain a stable on-resistance.

Third Embodiment

Figure 7:
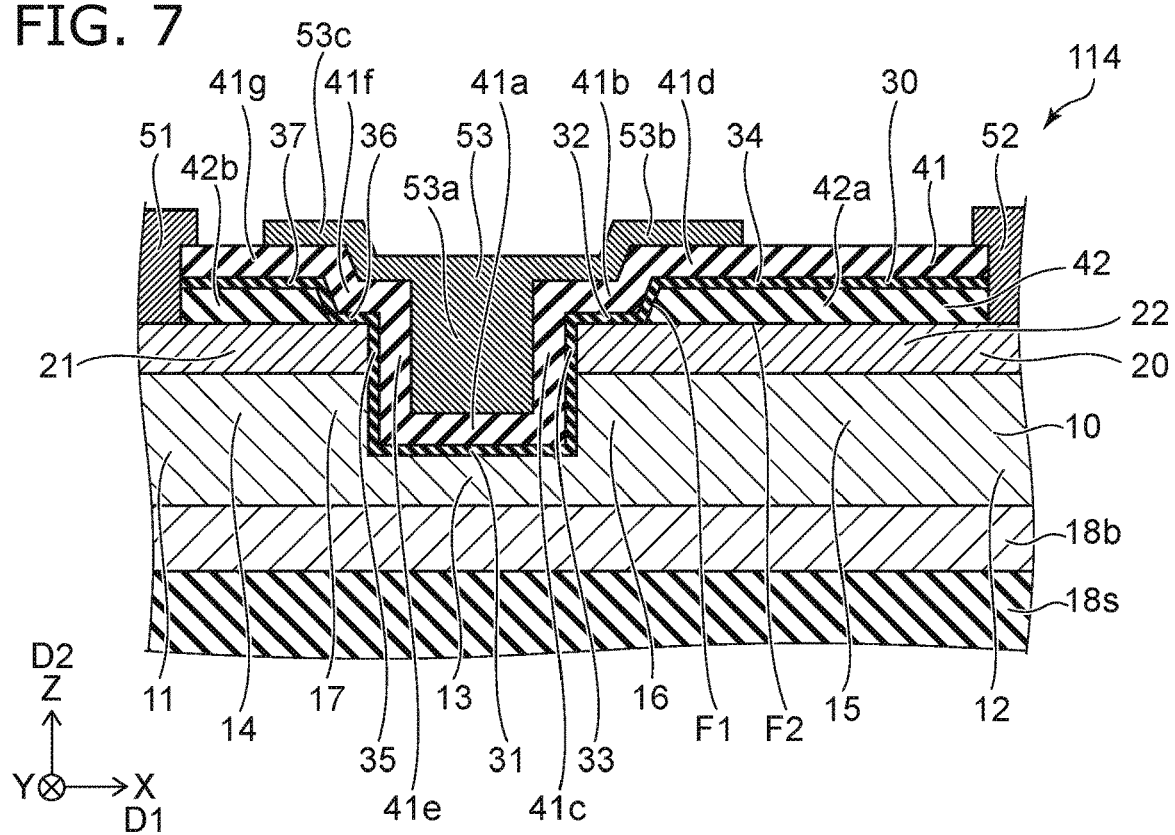
FIG. 7 is a schematic cross-sectional view illustrating a semiconductor device according to a third embodiment.

FIG. 7 is a schematic cross-sectional view illustrating a semiconductor device according to a third embodiment.

As shown in FIG. 7, in a semiconductor device 114 according to the embodiment, the side face of the first insulating region 42a is inclined. Except for this, the configuration of the semiconductor device 114 may be the same as the configuration of the semiconductor device 110.

As shown in FIG. 7, in the semiconductor device 114, the first insulating region 42a includes a first face F1 and a second face F2. The second face F2 faces the second semiconductor portion 22 in the second direction D2. The first face F1 faces the first electrode portion 53a in the first direction D1. The first face F1 is a side face of the first insulating region 42a. In semiconductor device 114, the first face F1 is inclined with respect to second face F2. By the inclined side face, for example, it becomes easier to obtain an electric field relaxation effect. For example, it becomes easy to obtain a high breakdown voltage.

As shown in FIG. 7, the side face of the second insulating region 42b may also be inclined.

The embodiments may include the following configurations (for example, technical proposals).

Configuration 1

A semiconductor device, comprising:
a first electrode;
a second electrode, a direction from the first electrode to the second electrode being along a first direction;
a third electrode including a first electrode portion and a second electrode portion, a position of the third electrode in the first direction being between a position of the first electrode in the first direction and a position of the second electrode in the first direction, the second electrode portion being connected to the first electrode portion;
a first semiconductor region including $Al_{x1}Ga_{1-x1}N$ (0≤x1<1), a first semiconductor region including a first partial region, a second partial region, a third partial region, a fourth partial region, a fifth partial region, and a sixth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the third partial region in the first direction and the position of the fifth partial region in the first direction;
a second semiconductor region including $Al_{x2}Ga_{1-x2}N$ (0<x2<1, x1<x2), the second semiconductor region including a first semiconductor portion and a second semiconductor portion, a direction from the fourth partial region to the first semiconductor portion being along the second direction, a direction from the fifth partial region and the sixth partial region to the second semiconductor portion being along the second direction;
a first nitride region including $Al_{z1}Ga_{1-z1}N$ (0<z1≤1, x2<z1), the first nitride region including a first nitride portion and a second nitride portion, the first nitride portion being located between the third partial region and the first electrode portion, the second nitride portion being located between the sixth partial region and the second electrode portion;
a first insulating member including a first insulating portion and a second insulating portion, the first insulating portion being located between the first nitride portion and the first electrode portion in the second direction, the second insulating portion being located between the second nitride portion and the second electrode portion in the second direction, the first insulating member including oxygen and at least one selected from the group consisting of Si and Al; and
a second insulating member including a first insulating region, a direction from the fifth partial region to the first insulating region being along the second direction, the second nitride portion being located between the first electrode portion and the first insulating region in the first direction, a part of the first insulating region being located between the fifth partial region and the second electrode portion in the second direction.

Configuration 2

The semiconductor device according to Configuration 1, wherein
the second nitride portion includes a crystal.

Configuration 3

The semiconductor device according to Configuration 1 or 2, wherein
the first insulating region is amorphous.

Configuration 4

The semiconductor device according to Configuration 2, wherein
a first thickness of the second nitride portion along the second direction is not less than 0.5 nm and not more than 10 nm.

Configuration 5

The semiconductor device according to any one of Configurations 1-4, wherein
the first insulating region includes at least one selected from the group consisting of Si and Al and at least one selected from the group consisting of nitrogen and oxygen.

Configuration 6

The semiconductor device according to any one of Configurations 1-5, wherein
at least a part of the first electrode portion is located between the first semiconductor portion and the second semiconductor portion in the first direction,
the first nitride region further includes a third nitride portion,
the first insulating member further includes a third insulating portion,
the third insulating portion is located between at least a part of the first electrode portion and the second semiconductor portion in the first direction, and
the third nitride portion is located between the third insulating portion and the second semiconductor portion in the first direction.

Configuration 7

The semiconductor device according to any one of Configurations 1-6, wherein
the first nitride region further includes a fourth nitride portion,
the first insulating member further includes a fourth insulating portion,
at least a part of the first insulating region is located between the second semiconductor portion and the fourth insulating portion, and
at least a part of the fourth nitride portion is located between the first insulating region and the fourth insulating portion.

Configuration 8

The semiconductor device according to Configuration 6, wherein
the first nitride region further includes a fifth nitride portion,
the first insulating member further includes a fifth insulating portion,
the fifth insulating portion is located between the first semiconductor portion and the first electrode portion, and
the fifth nitride portion is located between the first semiconductor portion and the fifth insulating portion.

Configuration 9

The semiconductor device according to any one of Configurations 1-8, wherein
a second thickness of the first insulating region along the second direction is not less than 5 nm and not more than 200 nm.

Configuration 10

The semiconductor device according to any one of Configurations 1-9, wherein
the first insulating region contacts the second electrode.

Configuration 11

The semiconductor device according to any one of Configurations 1-10, wherein
the first semiconductor region further includes a seventh partial region,
a position of the seventh partial region in the first direction is between the position of the fourth partial region in the first direction and the position of the third partial region in the first direction,
the third electrode further includes a third electrode portion,
the third electrode portion is connected to the first electrode portion,
a direction from the seventh partial region to the third electrode portion is along the second direction,
the first nitride region further includes a sixth nitride portion,
the first insulating member further includes a sixth insulating portion,
the sixth nitride portion is located between the first semiconductor portion and the third electrode portion in the second direction, and
the sixth insulating portion is located between the sixth nitride portion and the third electrode portion.

Configuration 12

The semiconductor device according to Configuration 11, wherein
the second insulating member includes a second insulating region, and
at least a part of the first semiconductor portion is located between the fourth partial region and the second insulating region in the second direction.

Configuration 13

The semiconductor device according to Configuration 12, wherein
the sixth nitride portion is located between the second insulating region and the first electrode portion in the first direction.

Configuration 14

The semiconductor device according to Configuration 13, wherein
the first nitride region further includes a seventh nitride portion,
the first insulating member further includes a seventh insulating portion,
the second insulating region is located between the first semiconductor portion and the seventh insulating portion, and
the seventh nitride portion is located between the second insulating region and the seventh insulating portion.

Configuration 15

The semiconductor device according to Configuration 14, wherein
at least a part of the third electrode portion overlaps at least a part of the second insulating region in the second direction.

Configuration 16

The semiconductor device according to Configuration 14, wherein
the third electrode portion does not overlap the second insulating region in the second direction.

Configuration 17

The semiconductor device according to any one of Configurations 1-16, wherein
the first semiconductor region further includes an eighth partial region,
a position of the eighth partial region in the first direction is between the position of the fifth partial region in the first direction and the position of the second partial region in the first direction,
the first nitride region further includes an eighth nitride portion,
the first insulating member further includes an eighth insulating portion,
a direction from the eighth partial region to the eighth nitride portion is along the second direction,
the eighth nitride portion is located between a part of the second semiconductor portion and the eighth insulating portion in the second direction, and
the eighth nitride portion contacts the second semiconductor portion.

Configuration 18

The semiconductor device according to Configuration 17, wherein
the eighth nitride portion is located between the first insulating region and the second electrode in the first direction.

Configuration 19

The semiconductor device according to any one of Configurations 1-18, wherein
the first insulating region includes a first face and a second face,
the second face faces the second semiconductor portion in the second direction,
the first face faces the first electrode portion in the first direction, and
the first face is inclined with respect to the second face.

Configuration 20

The semiconductor device according to any one of Configurations 1-19, wherein
the second nitride portion contacts a part of the second semiconductor portion, and
the first insulating region contacts another part of the second semiconductor portion.

According to the embodiment, it is possible to provide a semiconductor device with stable characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, nitride regions, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode to the second electrode being along a first direction;
a third electrode including a first electrode portion and a second electrode portion, a position of the third electrode in the first direction being between a position of the first electrode in the first direction and a position of the second electrode in the first direction, the second electrode portion being connected to the first electrode portion;
a first semiconductor region including $Al_{x1}Ga_{1-x1}N$ ($0 \le x1 < 1$), a first semiconductor region including a first partial region, a second partial region, a third partial region, a fourth partial region, a fifth partial region, and a sixth partial region, a second direction from the first partial region to the first electrode crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the third partial region in the first direction and the position of the fifth partial region in the first direction;
a second semiconductor region including $Al_{x2}Ga_{1-x2}N$ ($0 < x2 < 1$, $x1 < x2$), the second semiconductor region including a first semiconductor portion and a second semiconductor portion, a direction from the fourth partial region to the first semiconductor portion being along the second direction, a direction from the fifth partial region and the sixth partial region to the second semiconductor portion being along the second direction;
a first nitride region including $Al_{z1}Ga_{1-z1}N$ ($0 < z1 \le 1$, $x2 < z1$), the first nitride region including a first nitride portion and a second nitride portion, the first nitride portion being located between the third partial region and the first electrode portion, the second nitride portion being located between the sixth partial region and the second electrode portion;
a first insulating member including a first insulating portion and a second insulating portion, the first insulating portion being located between the first nitride portion and the first electrode portion in the second direction, the second insulating portion being located between the second nitride portion and the second electrode portion in the second direction, the first insulating member including oxygen and at least one selected from the group consisting of Si and Al; and
a second insulating member including a first insulating region, a direction from the fifth partial region to the first insulating region being along the second direction, the second nitride portion being located between the first electrode portion and the first insulating region in the first direction, a part of the first insulating region being located between the fifth partial region and the second electrode portion in the second direction.

2. The semiconductor device according to claim 1, wherein
the second nitride portion includes a crystal.

3. The semiconductor device according to claim 2, wherein
a first thickness of the second nitride portion along the second direction is not less than 0.5 nm and not more than 10 nm.

4. The semiconductor device according to claim 1, wherein
the first insulating region is amorphous.

5. The semiconductor device according to claim 1, wherein
the first insulating region includes at least one selected from the group consisting of Si and Al and at least one selected from the group consisting of nitrogen and oxygen.

6. The semiconductor device according to claim 1, wherein
at least a part of the first electrode portion is located between the first semiconductor portion and the second semiconductor portion in the first direction,
the first nitride region further includes a third nitride portion,
the first insulating member further includes a third insulating portion,
the third insulating portion is located between at least a part of the first electrode portion and the second semiconductor portion in the first direction, and
the third nitride portion is located between the third insulating portion and the second semiconductor portion in the first direction.

7. The semiconductor device according to claim 6, wherein
the first nitride region further includes a fifth nitride portion,
the first insulating member further includes a fifth insulating portion,
the fifth insulating portion is located between the first semiconductor portion and the first electrode portion, and
the fifth nitride portion is located between the first semiconductor portion and the fifth insulating portion.

8. The semiconductor device according to claim 1, wherein
the first nitride region further includes a fourth nitride portion,
the first insulating member further includes a fourth insulating portion,
at least a part of the first insulating region is located between the second semiconductor portion and the fourth insulating portion, and
at least a part of the fourth nitride portion is located between the first insulating region and the fourth insulating portion.

9. The semiconductor device according to claim 1, wherein
a second thickness of the first insulating region along the second direction is not less than 5 nm and not more than 200 nm.

10. The semiconductor device according to claim 1, wherein
the first insulating region contacts the second electrode.

11. The semiconductor device according to claim 1, wherein
the first semiconductor region further includes a seventh partial region,
a position of the seventh partial region in the first direction is between the position of the fourth partial region in the first direction and the position of the third partial region in the first direction,
the third electrode further includes a third electrode portion,
the third electrode portion is connected to the first electrode portion,
a direction from the seventh partial region to the third electrode portion is along the second direction,
the first nitride region further includes a sixth nitride portion,
the first insulating member further includes a sixth insulating portion,
the sixth nitride portion is located between the first semiconductor portion and the third electrode portion in the second direction, and
the sixth insulating portion is located between the sixth nitride portion and the third electrode portion.

12. The semiconductor device according to claim 1, wherein
the second insulating member includes a second insulating region, and
at least a part of the first semiconductor portion is located between the fourth partial region and the second insulating region in the second direction.

13. The semiconductor device according to claim 12, wherein
the sixth nitride portion is located between the second insulating region and the first electrode portion in the first direction.

14. The semiconductor device according to claim 13, wherein
the first nitride region further includes a seventh nitride portion,
the first insulating member further includes a seventh insulating portion,
the second insulating region is located between the first semiconductor portion and the seventh insulating portion, and
the seventh nitride portion is located between the second insulating region and the seventh insulating portion.

15. The semiconductor device according to claim 14, wherein
at least a part of the third electrode portion overlaps at least a part of the second insulating region in the second direction.

16. The semiconductor device according to claim 14, wherein
the third electrode portion does not overlap the second insulating region in the second direction.

17. The semiconductor device according to claim 1, wherein
the first semiconductor region further includes an eighth partial region,
a position of the eighth partial region in the first direction is between the position of the fifth partial region in the first direction and the position of the second partial region in the first direction,
the first nitride region further includes an eighth nitride portion,
the first insulating member further includes an eighth insulating portion,
a direction from the eighth partial region to the eighth nitride portion is along the second direction,
the eighth nitride portion is located between a part of the second semiconductor portion and the eighth insulating portion in the second direction, and
the eighth nitride portion contacts the second semiconductor portion.

18. The semiconductor device according to claim 17, wherein
the eighth nitride portion is located between the first insulating region and the second electrode in the first direction.

19. The semiconductor device according to claim 1, wherein
- the first insulating region includes a first face and a second face,
- the second face faces the second semiconductor portion in the second direction,
- the first face faces the first electrode portion in the first direction, and
- the first face is inclined with respect to the second face.

20. The semiconductor device according to claim 1, wherein
- the second nitride portion contacts a part of the second semiconductor portion, and
- the first insulating region contacts another part of the second semiconductor portion.

* * * * *